US010446720B2

(12) United States Patent
Hsu (10) Patent No.: US 10,446,720 B2
(45) Date of Patent: Oct. 15, 2019

(54) SEMICONDUCTOR STRUCTURE, LIGHT-EMITTING DEVICE AND MANUFACTURING METHOD FOR THE SAME

(71) Applicant: Industrial Technology Research Institute, Hsinchu (TW)

(72) Inventor: Jui-Mei Hsu, Zhubei (TW)

(73) Assignee: INDUSTRIAL TECHNOLOGY RESEARCH INSTITUTE, Chutung, Hsinchu (TW)

( * ) Notice: Subject to any disclaimer, the term of this patent is extended or adjusted under 35 U.S.C. 154(b) by 0 days.

(21) Appl. No.: 15/985,391

(22) Filed: May 21, 2018

(65) Prior Publication Data

US 2019/0165214 A1 May 30, 2019

(30) Foreign Application Priority Data

Nov. 29, 2017 (TW) .............................. 106141539 A (51) Int. Cl.
*H01L 33/40* (2010.01)
*H01L 33/00* (2010.01)

(52) U.S. Cl.
CPC ............ *H01L 33/40* (2013.01); *H01L 33/005* (2013.01); *H01L 33/0095* (2013.01); *H01L 2933/0016* (2013.01); *H01L 2933/0041* (2013.01); *H01L 2933/0066* (2013.01)

(58) Field of Classification Search
None
See application file for complete search history.

(56) References Cited

U.S. PATENT DOCUMENTS

| | | | |
|---|---|---|---|
| 4,970,196 A | 11/1990 | Kim et al. | |
| 6,486,008 B1 | 11/2002 | Lee | |
| 6,613,610 B2 | 9/2003 | Iwafuchi et al. | |
| 8,257,538 B2 | 9/2012 | Doi et al. | |
| 8,333,860 B1 | 12/2012 | Bibl et al. | |
| 8,506,867 B2 | 8/2013 | Menard | |
| 8,963,179 B2* | 2/2015 | Choi | H01L 33/42 257/98 |
| 9,358,775 B2 | 6/2016 | Bower et al. | |
| 9,363,881 B2 | 6/2016 | Weng et al. | |
| 9,583,450 B2 | 2/2017 | Li et al. | |

(Continued)

FOREIGN PATENT DOCUMENTS

| | | |
|---|---|---|
| TW | 200302676 A | 8/2003 |
| TW | 200302679 A | 8/2003 |

(Continued)

OTHER PUBLICATIONS

Guillemot et al., "High-throughput laser printing of cells and biomaterials for tissue engineering," Acta Biomaterialia 6, 2010, pp. 2494-2500.

(Continued)

*Primary Examiner* — Chandra Chaudhari
(74) *Attorney, Agent, or Firm* — Muncy, Geissler, Olds, & Lowe, P.C.

(57) ABSTRACT

A semiconductor structure, a light-emitting device and a manufacturing method for the same are provided. The light-emitting device includes a light emitting diode and a conductive film. The conductive film contains quantum dots and is disposed on the light emitting diode.

18 Claims, 6 Drawing Sheets

(56) References Cited

U.S. PATENT DOCUMENTS

| | | | |
|---|---|---|---|
| 9,607,907 | B2 | 3/2017 | Wu et al. |
| 2003/0197170 | A1 | 10/2003 | Bader et al. |
| 2005/0233504 | A1 | 10/2005 | Doi et al. |
| 2011/0151602 | A1 | 6/2011 | Speier |
| 2014/0111837 | A1 | 4/2014 | Menz |
| 2014/0264763 | A1 | 9/2014 | Meitl et al. |
| 2015/0333227 | A1* | 11/2015 | Lee ............... H01L 33/502 438/27 |
| 2017/0062400 | A1 | 3/2017 | Li et al. |
| 2017/0338199 | A1 | 11/2017 | Zou et al. |

FOREIGN PATENT DOCUMENTS

| | | |
|---|---|---|
| TW | I554655 B | 10/2016 |
| TW | I579405 B | 4/2017 |
| WO | WO2015/193433 A3 | 12/2015 |
| WO | WO2016/060676 A1 | 4/2016 |
| WO | WO2017/008253 A1 | 1/2017 |

OTHER PUBLICATIONS

Nagel et al., "Laser-Induced Forward Transfer for the Fabrication of Devices," Nanomateriais; Processing and Characterization with Lasers, 2012, pp. 255-316.

Meitl et al., "Transfer printing by kinetic control of adhesion to an eiastomeric stamp," Nature Materials, vol. 5, Jan. 2006, pp. 33-38.

Seo et al., "Simplified Method of Making Flexible Blue LEDs on a Plastic Substrate," IEEE Photonics Journal, vol. 7, No. 2, Apr. 2015, 8 pages.

Lin et al., High-Power GaN-Mirror-Cu Light-Emitting Diodes for Vertrical Current Injection Using Laser Liftoff and Electroplaying Techniques, IEEE Photonics Technology Letters, vol. 17, No. 9, Sep. 2005, pp. 1809-1811.

Lee et al., "Dichromatic InGaN-based white light emitting diodes by using laser lift-off and wafer-bonding schemes," Applied Physics Letters, vol. 90, 2007, 4 pages.

Wong et al., "Fabrication of thin-film InGaN light-emitting diode membranes by laser lift-off," Applied Physics Letter, vol. 75, 1999, 4 pages.

* cited by examiner

SEMICONDUCTOR STRUCTURE, LIGHT-EMITTING DEVICE AND MANUFACTURING METHOD FOR THE SAME

This application claims the benefit of Taiwan application Serial No. 106141539, filed Nov. 29, 2017, the subject matter of which is incorporated herein by reference.

TECHNICAL FIELD

The disclosure relates in general to a semiconductor structure and a manufacturing method for the same, and more particularly to a light-emitting device and a manufacturing method for the same.

BACKGROUND

With advance of a semiconductor technique, various elements have been developed toward a volume trend of scaling down. For example, various micro-display techniques have been published recently. The technique of the light-emitting diode has broken through in size. A micro-light-emitting diode (micro-LED) display manufactured by arranging the light-emitting diodes as an array has gradually arisen great attentions in a commercial market. The micro-light-emitting diode is a kind of active light-emitting element displays, which has contrast ratio and power consumption comparable with an organic light-emitting diode (OLED) display, and is preponderate in reliability and life time. Therefore, there will be great potential for the micro-light-emitting diode display to be a mainstream display technology applied for wearable electronic devices for a mobile communication electronic product and internet of things (IoT) in the future. However, there are problems need to be overcome relating with transferring the micro-light-emitting diodes of a great amount.

SUMMARY

The present disclosure relates to a semiconductor structure and manufacturing method for the same.

According a concept of an embodiment of the present disclosure, a manufacturing method for a semiconductor structure is disclosed. The manufacturing method comprises the following steps. An element adhesion step comprises adhering a semiconductor element onto a first surface of a light-transmitting substrate. An element transfer step comprises performing an irradiating step to the light-transmitting substrate being wholly separated from an acceptor substrate by an empty space. The irradiating step causes a vaporizing phenomenon between the light-transmitting substrate and the semiconductor element. The vaporizing phenomenon allows the semiconductor element to be pushed away from the light-transmitting substrate and then pass through the empty space to get onto the acceptor substrate.

According a concept of another embodiment of the present disclosure, a manufacturing method for a semiconductor structure is disclosed. The manufacturing method comprises the following steps. An element adhesion step comprises coating an adhesive layer containing quantum dots onto a first surface of a light-transmitting substrate. The adhesive layer has a conductive property. An element transfer step comprises performing an irradiating step to the light-transmitting substrate so as to cause a vaporizing phenomenon between the light-transmitting substrate and the adhesive layer containing the quantum dots. The vaporizing phenomenon allows the adhesive layer containing the quantum dots to be pushed away from the light-transmitting substrate and then pass through the empty space to get onto the acceptor substrate.

According a concept of yet another embodiment of the present disclosure, a light-emitting device is disclosed. The light-emitting device comprises a light-emitting diode and a conductive film containing quantum dots. The conductive film is disposed on the light-emitting diode. The conductive film is used as an electrode layer of the light-emitting diode.

The above and other aspects of the disclosure will become better understood with regard to the following detailed description of the preferred but non-limiting embodiment(s). The following description is made with reference to the accompanying drawings.

DETAILED DESCRIPTION

Embodiments are provided hereinafter with reference to the accompanying drawings for describing the related procedures and configurations. It is noted that not all embodiments of the invention are shown. The identical and/or similar elements of the embodiments are designated with the same and/or similar reference numerals. Also, it is noted that there may be other embodiments of the present disclosure which are not specifically illustrated. Modifications and variations can be made without departing from the spirit of the disclosure to meet the requirements of the practical applications. It is also important to point out that the illustrations may not be necessarily drawn to scale. Thus, the specification and the drawings are to be regard as an illustrative sense rather than a restrictive sense.

First Embodiment

FIG. 1A to FIG. 1D illustrate a manufacturing method for a semiconductor structure according to a concept of a first embodiment.

Figure 1A:
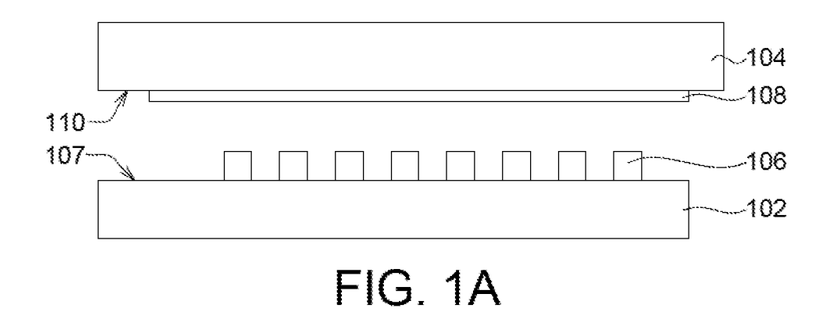
FIG. 1A to FIG. 1D illustrate a manufacturing method for a semiconductor structure according to a concept of a first embodiment.

Referring to FIG. 1A, an element formation step is performed to form elements respectively on a donor substrate 102 and a light-transmitting substrate 104. For example, semiconductor elements 106 are disposed on or formed on a first surface 107 of the donor substrate 102. In embodiments, the semiconductor elements 106 may comprise a thin film device, such as a semiconductor light-emitting element, comprising a micro-light-emitting diode, etc., or other elements or devices that can be formed by a semiconductor process. In another embodiment, the semiconductor elements 106 may comprise an adhesive layer containing quantum dots, or a combination of the semiconductor light-emitting element and the adhesive layer containing the quantum dots. The adhesive layer has a conductive property or a non-conductive property (which will be described in detail below). Moreover, a light-absorbing and vaporizable adhesive layer 108 is disposed on a first surface 110 of the light-transmitting substrate 104.

Figure 1B:
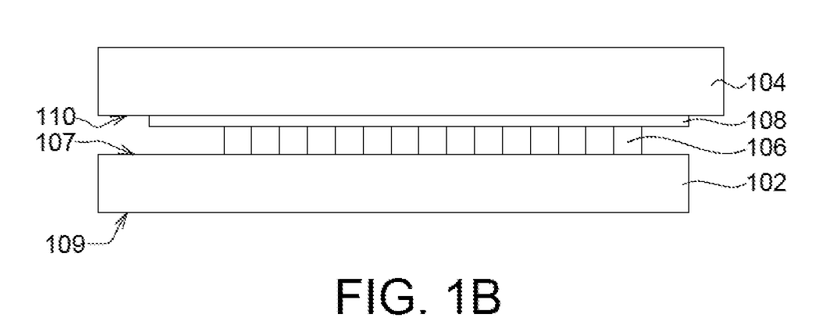

Referring to FIG. 1B, an element adhesion step is performed. In the element adhesion step, the donor substrate 102 and the light-transmitting substrate 104 are orientated with the first surface 107 of the donor substrate 102 and the first surface 110 of the light-transmitting substrate 104 facing to each other, and then the semiconductor elements 106 on the donor substrate 102 are adhered and transferred onto the first surface 110 of the light-transmitting substrate 104. For example, the semiconductor elements 106 are disposed to touch the light-absorbing and vaporizable adhesive layer 108, and may be adhered to the light-absorbing and vaporizable adhesive layer 108 with using an adhesive property of the light-absorbing and vaporizable adhesive layer 108. In embodiments, after the semiconductor elements 106 are adhered to the light-absorbing and vaporizable adhesive layer 108, the semiconductor elements 106 may be removed from the donor substrate 102, with the light-absorbing and vaporizable adhesive layer 108 adhering the semiconductor elements 106 and the light-transmitting substrate 104, so as to transfer the semiconductor elements 106 onto the light-transmitting substrate 104.

In an embodiment, for example, the donor substrate 102 may comprise a semiconductor substrate, such as a sapphire substrate. The semiconductor elements 106 comprises semiconductor material layers epitaxially grown from the sapphire substrate, wherein the most bottom layer contacting with the sapphire substrate is a GaN thin film. In this case, the semiconductor elements 106 and the donor substrate 102 may be separated from each other by performing an irradiating step (for example an KrF laser step in a temperature higher than 40° C.) to a second surface 109 of the donor substrate 102 to decompose the GaN thin film into a nitrogen gas and a metal Ga to weaken a bonding force between the semiconductor elements 106 and the donor substrate 102. The second surface 109 of the donor substrate 102 is opposing to the first surface 107 of the donor substrate 102. In some embodiments, the donor substrate 102 may be partially irradiated. In other words, the irradiating step may be performed to a portion of the second surface 109 of the donor substrate 102, by which to remove a portion of the semiconductor elements 106 from the donor substrate 102. The remained semiconductor elements 106 not separated from the donor substrate 102 may be used in other processes according to actual demands.

Figure 1C:
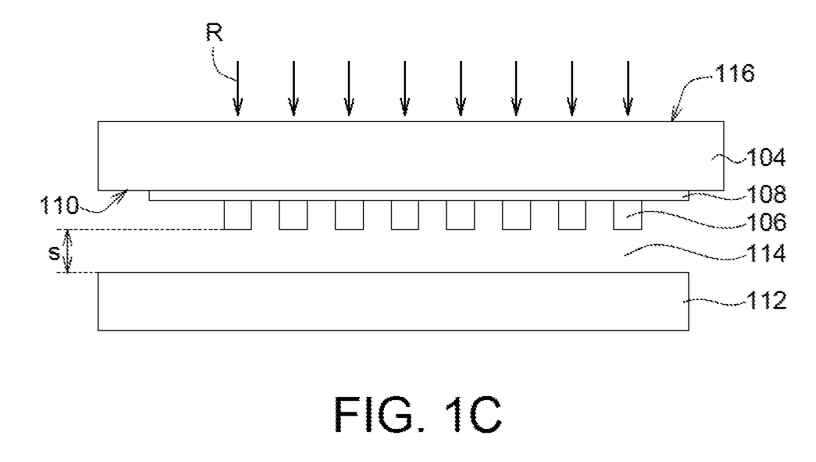
Figure 1D:
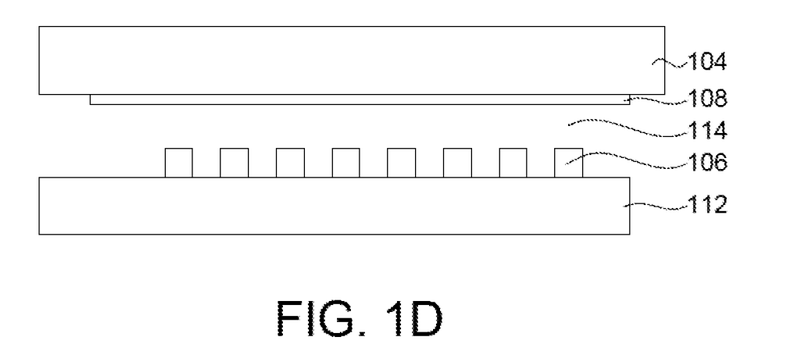

Referring to FIG. 1C and FIG. 1D, an element transfer step is performed. The element transfer step comprises performing an irradiating step R to generate a vaporization. A gas generated from the vaporization pushes an element (or elements) on the light-transmitting substrate 104 away from the light-transmitting substrate 104 to an acceptor substrate 112. In embodiments, the irradiating step R (FIG. 1C) is performed to the light-transmitting substrate 104 with the semiconductor elements 106 totally separated from the acceptor substrate 112 by an empty space 114. A vaporizing phenomenon is generated between the light-transmitting substrate 104 and the semiconductor elements 106 by the irradiating step R. The vaporizing phenomenon allows the semiconductor elements 106 to be pushed away from the light-transmitting substrate 104 and then pass through the empty space 114 to transfer onto the acceptor substrate 112. Specifically, in the irradiating step R, an irradiating light transmitting through the light-transmitting substrate 104 is get into the light-absorbing and vaporizable adhesive layer 108 and is absorbed by the light-absorbing and vaporizable adhesive layer 108 to cause a vaporization. A gas from the vaporization forms a pressure force capable of pushing the semiconductor elements 106 adhered on the light-transmitting substrate 104 away from the light-transmitting substrate 104, such as a gas source force sufficient for shooting the semiconductor elements 106. The pushed-away semiconductor elements 106 pass through the empty space 114 and transfer onto the acceptor substrate 112 (FIG. 1D).

As the concepts described above, in embodiments, the light-absorbing and vaporizable adhesive layer 108 has a structural design capable of adhering the semiconductor elements 106 contacting thereon, and capable of having a vaporization generating a gas pressure force pushing away the semiconductor elements 106 after absorbing a light energy.

In an embodiment, the light-absorbing and vaporizable adhesive layer 108 consists of a single-layer film. The single-layer film provides an adhesive property, a light-absorbing property, and a vaporizable property at the same time. In other word, the single-layer film has properties for a vaporizable layer, a light-absorbing layer and an adhesive layer. In another embodiment, the light-absorbing and vaporizable adhesive layer 108 consists of a multilayer film. For example, the light-absorbing and vaporizable adhesive layer 108 may comprise two layer films, wherein one of the two layer films functions as the light-absorbing layer, and the other of the two layer films functions as the adhesive layer. The light-absorbing layer can provide the light-absorbing property (absorbing a light energy and turning it into a heat energy). For example, the light-absorbing layer may comprise a metal material, or a polymer material. The adhesive layer can provide the adhesive property. Any one or both of the two layer films can have a property capable of being vaporized due to the heat energy. In other words, the light-absorbing layer also has the property for the vaporizable layer, and/or the adhesive layer also has the property for the vaporizable layer. In yet another embodiment, the light-absorbing and vaporizable adhesive layer 108 may comprise a multilayer film of three or more layers, wherein at least one of them functions as the light-absorbing layer providing the light-absorbing property, at least another one of them functions as the adhesive layer providing the adhesive property, and at least yet another one of them functions as the vaporizable layer having the property capable of being vaporized. The adhesive layer having the adhesive property may be disposed as the outermost layer for adhering the semiconductor elements 106. The light-absorbing and vaporizable adhesive layer 108 may be formed by a coating method, or other suitable methods.

In the light-absorbing and vaporizable adhesive layer 108, the film being vaporized by the irradiating step R is that having a vaporizing temperature (i.e. boiling point) lower than the others. The film having the vaporizable property may comprise a metal, a polymer such as triazene, a hydrocarbon coated film such as propane, TMS, or other suitable materials. In an embodiment, the film having the adhesive property may comprise a gel material, and a property of which may be changed by the irradiating step R. For example, the film having the adhesive property may be irradiated with a UV light or an IR light, before or after the semiconductor elements 106 are adhered thereto. For example, the coated gel material may be partially irradiated by a light beam so as to define a pattern having the adhesive property before the semiconductor elements 106 are adhered to the coated gel material. In an embodiment, the film having the light-absorbing property and the adhesive property at the same time may be a film having a nano-sized metal distributed in an adhesive gel, or a film having an IR-780 iodide polymer distributed in an adhesive gel, but not limited thereto. In some embodiments, before the element transfer step, the film having the adhesive property which the semiconductor elements 106 are adhered to may be a gel material in a semi-cured state or a liquid state. Such gel material may comprise a polyimide, an acrylic compound, an epoxy compound, PEDOT, a hydrocarbon polymer, etc. The film having the adhesive property may have a conductive property (such as a transparent conductive polymer PEDOT) or have a non-conductive property. In some embodiments, the film having the adhesive property may contain additional quantum dots or other semiconductor micro particles distributed therein according to actual product demands. In some embodiments, a property of the film having the adhesive property may be changed by various methods. For example, the adhesive property of the film having the adhesive property may be generated by a pre-baking step, and then the film having the adhesive property may be wholly cured by a post-baking step.

In embodiments, the irradiating step R may use a laser light source, but is not limited thereto, and may use other light sources capable of providing a sufficient energy for generating the vaporization in the light-absorbing and vaporizable adhesive layer 108. For example, the laser light source can be focused into a small spot size range, and can be controlled to irradiate a determined region in a continuous irradiating mode or a single point irradiating mode. Therefore, using the laser light source can precisely control the part of the semiconductor elements 106 determined to be transferred with any transferring orders. Moreover, the laser light source has ability of instantly causing a thermal vaporization in the light-absorbing and vaporizable adhesive layer 108 to generate a gas pressure force for shooting the semiconductor elements 106. In some embodiments, the heat energy caused from the optical energy by the irradiating step R may weaken adhesion ability of the light-absorbing and vaporizable adhesive layer 108 (or the adhesive layer). For example, the light-absorbing and vaporizable adhesive layer 108 (or the adhesive layer) may comprise a thermosensitive adhesive material.

In an embodiment, the irradiating step R may be performed in a condition that the semiconductor elements 106 and the acceptor substrate 112 having an empty gap distance S being 10-300 μm (FIG. 1C) therebetween, but the present disclosure is not limited thereto. The range of the empty gap distance S may be properly adjusted according to actual demands. An element having an adhesive property (not shown) may be disposed on the acceptor substrate 112 to adhere and fix the semiconductor elements 106 dropping down thereon. The element having the adhesive property may comprise an adhesive glue layer, a bonding layer, etc., and may use a material having a conductive property or a non-conductive property, according to product demands.

In some comparative examples, no film capable being vaporized by the irradiating step R is disposed between the semiconductor elements 106 and the light-transmitting substrate 104. In the element transfer step, the irradiating step R may be performed to the adhesive layer to which the semiconductor elements 106 is adhered under a condition that the semiconductor elements 106 are separated from the acceptor substrate 112 by the empty space 114, to weaken an adhesion or even invalid the adhesion between the adhesive layer and the semiconductor elements 106. However, it is found that in comparative examples, as the semiconductor elements 106 are scaled down to a size degree (for example a feature size of 1 to 100 micrometers for a micro-light-emitting diode), although no adhesive force from the adhesive property of the adhesive layer exists between the semiconductor elements 106 and the adhesive layer, the gravitational weight of the semiconductor elements 106 is still not enough to overcome a van der Waals force between the semiconductor elements 106 and the adhesive layer, and thus the semiconductor elements 106 could not transfer from the light-transmitting substrate 104 to the acceptor substrate 112. On the contrary, in the present embodiments, the light-absorbing and vaporizable adhesive layer 108 comprises the film capable of being vaporized by the irradiating step R, and the gas generated from the vaporization can facilitate an effective transferring of the semiconductor elements 106 from the light-transmitting substrate 104 to the acceptor substrate 112, and it is also effective for the semiconductor elements 106 of small sizes.

Moreover, in the element transfer step according to embodiments, through the irradiating step R, the semiconductor elements 106 may be directly transferred from the light-transmitting substrate 104 onto the acceptor substrate 112 without using an additional transferring jig. Therefore, the manufacturing method according to embodiments is easy and has a low cost.

Referring to FIG. 1D, a semiconductor device formed by the element transfer step may comprise the acceptor substrate 112 and the semiconductor elements 106. The acceptor substrate 112 may be the substrate, such as a semiconductor substrate, a circuit board, etc. The semiconductor elements 106 are disposed on the acceptor substrate 112. In an embodiment, the semiconductor device comprises a light-emitting device, a light source device (such as a back light device, a front light device, etc.). For example, the semiconductor elements 106 may comprise light-emitting diodes, such as micro-light-emitting diodes (micro LEDs), but are not limited thereto. The semiconductor elements 106 may be other kinds of semiconductor light-emitting units.

The present disclosure is not limited to simultaneously transferring all the semiconductor elements 106 on the light-transmitting substrate 104 onto the acceptor substrate 112 disclosed in the first embodiments. In other embodiments, the element transfer step may be selectively performed to the semiconductor elements 106 on the light-transmitting substrate 104.

Second Embodiment

Figure 2A:
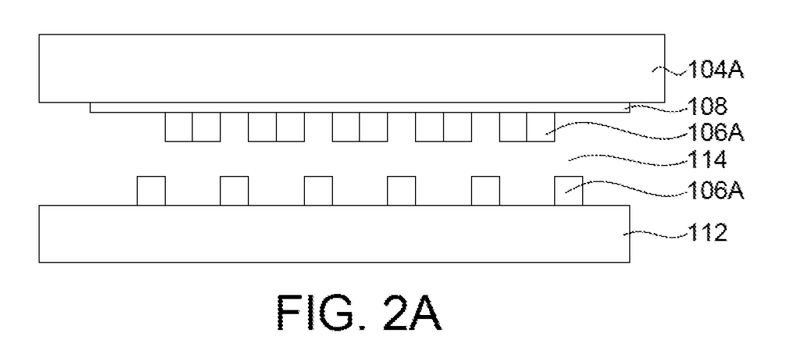
FIG. 2A to FIG. 2B illustrate a manufacturing method for a semiconductor structure according to a concept of a second embodiment.
Figure 2B:
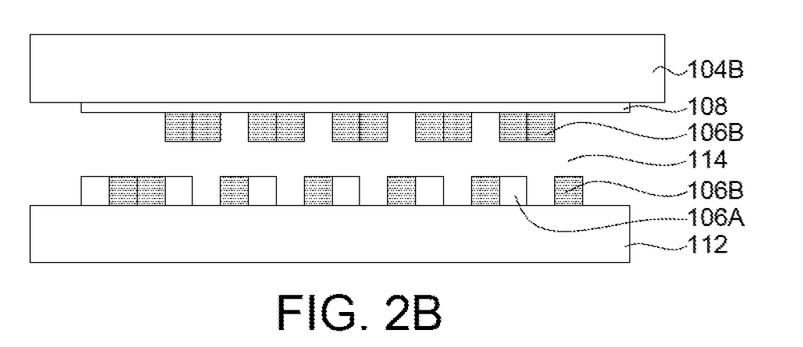

FIG. 2A to FIG. 2B illustrate a manufacturing method for a semiconductor structure according to a concept of a second embodiment. Referring to FIG. 2A, in the element transfer step, a region to be irradiated of the light-transmitting substrate 104A may be adjusted to control a portion to be transferred for the semiconductor elements 106A. Specifically, the irradiating step R is performed to only a portion region of the light-transmitting substrate 104A so as to transfer only a portion of the semiconductor elements 106A on the light-transmitting substrate 104A onto the acceptor substrate 112. Referring to FIG. 2B, another element transfer step may be then performed by irradiating a portion region of a light-transmitting substrate 104B to transfer a portion of semiconductor elements 106B onto the acceptor substrate 112.

In embodiments, a pitch between the transferred semiconductor elements 106A and 106B may be adjusted according to actual demands. The pitch between the transferred semiconductor elements 106A and 106B may be an integral multiple of a width of the element. In some embodiments, the semiconductor elements 106A have a size different from a size of the semiconductor elements 106B. For example, micro-light-emitting diodes of different colors may have different heights respectively. The contact element transfer step may easily suffer a low product yield issue resulted from a contacting between the elements due to a height difference therebetween. On the contrary, in the manufacturing method described according to FIG. 2A to FIG. 2B, during the another element transfer step, the semiconductor elements 106B on the light-transmitting substrate 104B do not contact with the transferred semiconductor elements 106A on the acceptor substrate 112. Accordingly, the semiconductor elements 106A and the semiconductor elements 106B having different height and transferred by individual element transfer steps would not affect to each other. Therefore, the manufacturing method according to embodiments can result in a good product yield. In other embodiments, semiconductor elements of other kinds of structures on other light-transmitting substrates (not shown) may be transferred onto the acceptor substrate 112 by additional element transfer steps to form an element array with the semiconductor elements 106A and the semiconductor elements 106B.

Third Embodiment

Figure 3:
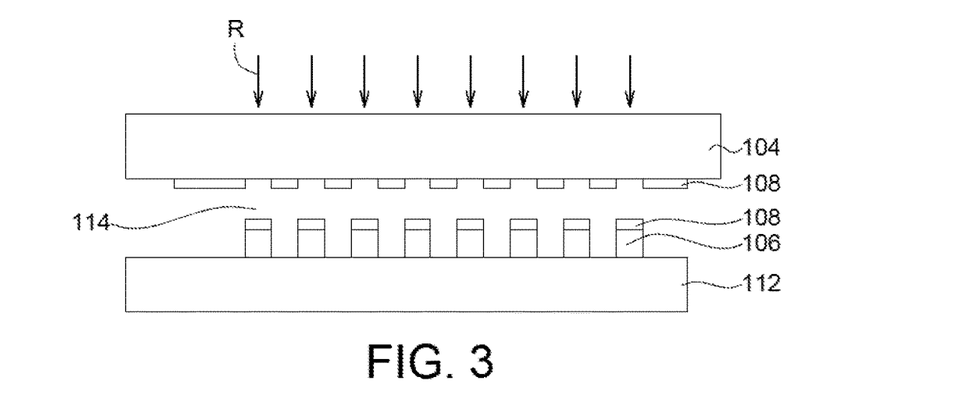
FIG. 3 illustrates a manufacturing method for a semiconductor structure according to a concept of a third embodiment.

FIG. 3 illustrates a manufacturing method for a semiconductor structure according to a concept of a third embodiment. The third embodiment is similar to the first embodiment. It should be noted that in the element transfer step according to the third embodiment, the light-absorbing and vaporizable adhesive layer 108 and the semiconductor elements 106 are transferred together with each other from the light-transmitting substrate 104 to the acceptor substrate 112. In an embodiment, for example, a portion of the light-absorbing and vaporizable adhesive layer 108 may be vaporized through the irradiating step R, and the remained portion of the light-absorbing and vaporizable adhesive layer 108 not vaporized through the irradiating step R are transferred together with the semiconductor elements 106 by being pushed down to the acceptor substrate 112 with the gas generated from the vaporized portion of the light-absorbing and vaporizable adhesive layer 108. In another embodiment, the adhesive property of the light-absorbing and vaporizable adhesive layer 108 by which the light-absorbing and vaporizable adhesive layer 108 adheres the light-transmitting substrate 104 may be invalided by the irradiating step R, and thus the light-absorbing and vaporizable adhesive layer 108 are transferred together with the semiconductor elements 106 to the acceptor substrate 112 by being pushed down by the gas generated from the vaporization.

Fourth Embodiment

Figure 4:
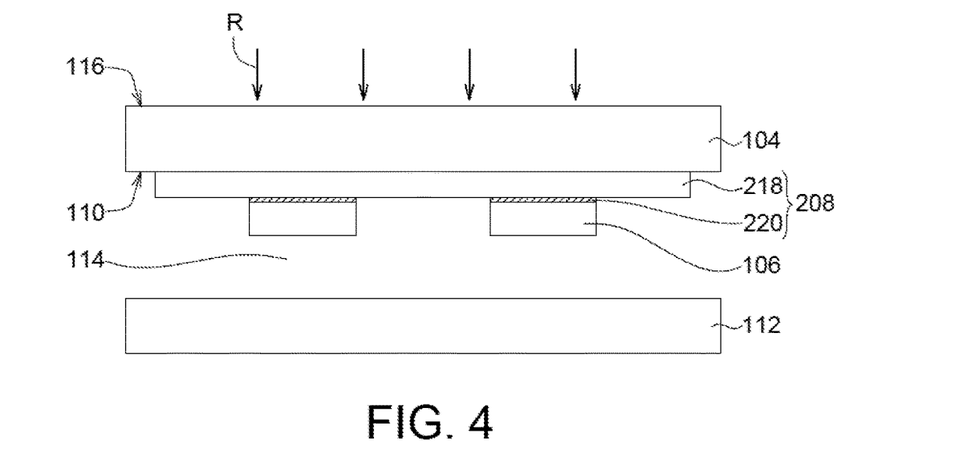
FIG. 4 illustrates a manufacturing method for a semiconductor structure according to a concept of a fourth embodiment.

FIG. 4 illustrates a manufacturing method for a semiconductor structure according to a concept of a fourth embodiment. The fourth embodiment is similar to the first embodiment. It should be noted that in the fourth embodiment, a light-absorbing and vaporizable adhesive layer 208 comprises an adhesive layer 218 and a light-absorbing layer 220. The adhesive layer 218 is disposed on the first surface 110 of the light-transmitting substrate 104. The light-absorbing layer 220 is disposed between the adhesive layer 218 and the semiconductor elements 106, and is overlapped with the semiconductor elements 106.

In the fourth embodiment, the element formation step may further comprise forming the light-absorbing layer 220 (not shown in FIG. 1A) on the semiconductor elements 106 after the step for forming the semiconductor elements 106 on the donor substrate 102 as described referring to FIG. 1A. In an embodiment, the semiconductor elements 106 may be light-emitting diodes having a P-type electrode and an N-type electrode respectively on opposing sides thereof, and the light-absorbing layer 220 may be a metal conductive contact pad formed on one of the P-type electrode and the N-type electrode. Moreover, the adhesive layer 218 is disposed on the first surface 110 of the light-transmitting substrate 104. In other words, the light-absorbing and vaporizable adhesive layer 108 as shown in FIG. 1A is replaced by the adhesive layer 218.

In the element adhesion step according to the fourth embodiment, the light-absorbing layer 220 on the donor substrate 102 (not shown in FIG. 4) is adhered to the adhesive layer 218 on the light-transmitting substrate 104, and then the semiconductor elements 106 are separated from the donor substrate 102, by which the semiconductor elements 106 and the light-absorbing layer 220 on the semiconductor elements 106 are transferred from the donor substrate 102 to the light-transmitting substrate 104.

Referring to FIG. 4, in the element transfer step according to the fourth embodiment, the irradiating step R is performed to the light-transmitting substrate 104 under a condition that the semiconductor elements 106 are wholly separated from the acceptor substrate 112 by the empty space 114. The light-absorbing layer 220 can absorb the optical energy from the irradiating step R and turn the optical energy into the heat energy. Such heat energy may be used to vaporize at least a portion of the adhesive layer 218 adjoined with the light-absorbing layer 220 to generate the gas pressure force for pushing the semiconductor elements 106 away to the acceptor substrate 112. In an embodiment, the portion of the adhesive layer 218 to be vaporized by the irradiating step R can be self-aligned with using the light-absorbing layer 220, and thus the irradiating can have a bigger misalignment-tolerant. In an embodiment, the semiconductor elements 106 and the light-absorbing layer 220 are transferred together from the light-transmitting substrate 104 to the acceptor substrate 102.

Fifth Embodiment

Figure 5:
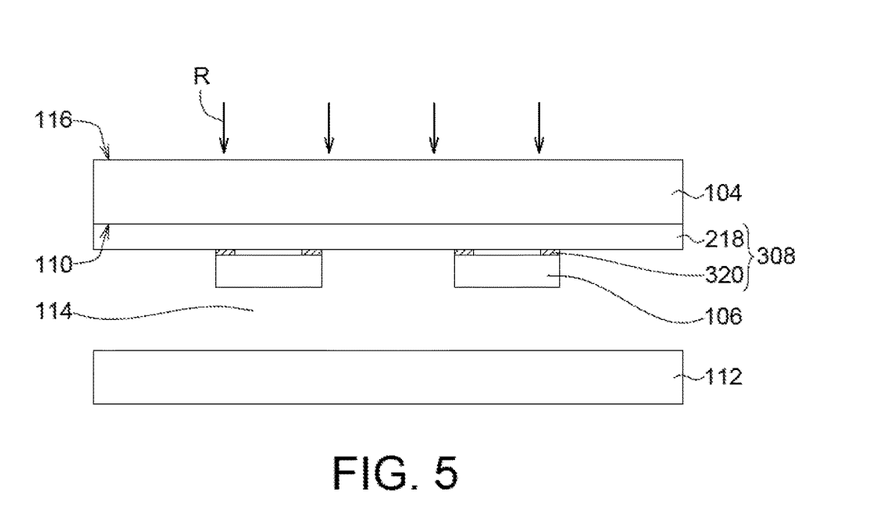
FIG. 5 illustrates a manufacturing method for a semiconductor structure according to a concept of a fifth embodiment.

FIG. 5 illustrates a manufacturing method for a semiconductor structure according to a concept of a fifth embodiment. The fifth embodiment is similar to the fourth embodiment. It should be noted that in the fifth embodiment, a light-absorbing and vaporizable adhesive layer 308 comprises the adhesive layer 218 and a light-absorbing layer 320. Portions of the light-absorbing layer 320 corresponding to the single semiconductor element 106 have patterns separated from each other. In other words, the light-absorbing layer 320 between the adhesive layer 218 and the semiconductor elements 106 overlaps with a portion of the semiconductor elements 106. For example, the semiconductor elements 106 may be light-emitting diodes having a P-type electrode and an N-type electrode on the same side thereof, and the light-absorbing layer 320 may comprise metal conductive contact pads respectively formed on the P-type electrode and the N-type electrode.

Sixth Embodiment

Figure 6:
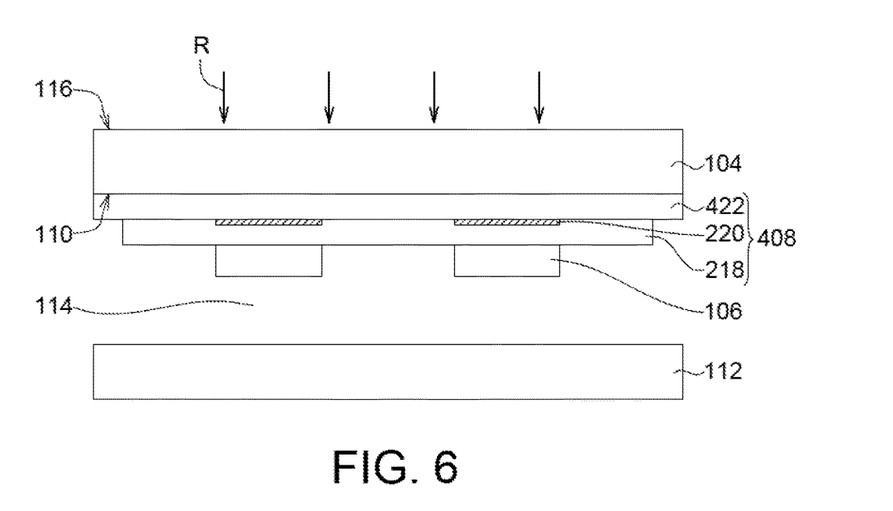
FIG. 6 illustrates a manufacturing method for a semiconductor structure according to a concept of a sixth embodiment.

FIG. 6 illustrates a manufacturing method for a semiconductor structure according to a concept of a sixth embodiment. The sixth embodiment is similar to the fourth embodiment. It should be noted that in the sixth embodiment, a light-absorbing and vaporizable adhesive layer 408 comprises a vaporizable layer 422, the light-absorbing layer 220 and the adhesive layer 218. The light-absorbing and vaporizable adhesive layer 408 is disposed on the first surface 110 of the light-transmitting substrate 104. The light-absorbing layer 220 is disposed between the adhesive layer 218 and the vaporizable layer 422, and is overlapped with the semiconductor elements 106.

In the element formation step according to the sixth embodiment, the vaporizable layer 422 may be disposed on the first surface 110 of the light-transmitting substrate 104 before disposing the adhesive layer 218. In other words, the vaporizable layer 422, the light-absorbing layer 220 and the adhesive layer 218 are sequentially formed on the light-transmitting substrate 104. In the element adhesion step according to the sixth embodiment, the semiconductor elements 106 on the donor substrate 102 are adhered to the adhesive layer 218 on the light-transmitting substrate 104, and then the semiconductor elements 106 are separated from the donor substrate 102, by which the semiconductor elements 106 are transferred from the donor substrate 102 to the light-transmitting substrate 104.

Referring to FIG. 6, in the element transfer step according to the sixth embodiment, the irradiating step R is performed to the light-transmitting substrate 104 under a condition that the semiconductor elements 106 are wholly separated from the acceptor substrate 112 by the empty space 114. The light-absorbing layer 220 can absorb the optical energy from the irradiating step R and turn the optical energy into the heat energy. Such heat energy may be used to vaporize at least a portion of the vaporizable layer 422 adjoined with the light-absorbing layer 220 to generate the gas pressure force for pushing the semiconductor elements 106 away to the acceptor substrate 112. In some embodiments, the irradiating step R also cause the vaporization in the light-absorbing layer 220, forming the gas pressure force for pushing away the semiconductor elements 106. In an embodiment, for example, the portion to be vaporized by the irradiating step R can be self-aligned with using the light-absorbing layer 220, and thus the irradiating can have a bigger misalignment-tolerant. In some embodiments, the light-absorbing layer 220 and a portion of the adhesive layer 218 overlapping with the semiconductor elements 106 may be transferred together with the semiconductor elements 106 from the light-transmitting substrate 104 to the acceptor substrate 112. Moreover, in some embodiments, after the element transfer step, the adhesive layer 218 and the light-absorbing layer 220 may be removed from the semiconductor elements 106.

Seventh Embodiment

Figure 7:
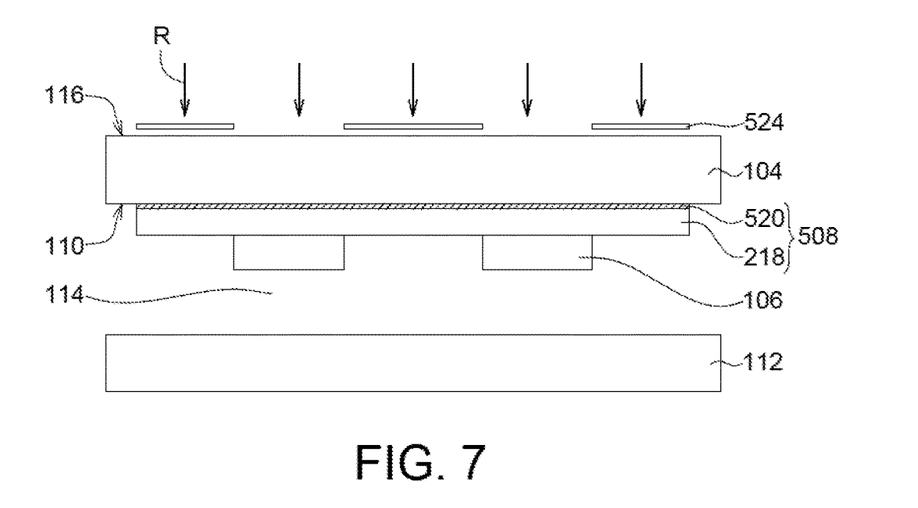
FIG. 7 illustrates a manufacturing method for a semiconductor structure according to a concept of a seventh embodiment.

FIG. 7 illustrates a manufacturing method for a semiconductor structure according to a concept of a seventh embodiment. The seventh embodiment is similar to the fourth embodiment. It should be noted that in the seventh embodiment, a light-absorbing and vaporizable adhesive layer 508 comprises a light-absorbing layer 520 and the adhesive layer 218. The light-absorbing layer 520 is disposed on the first surface 110 of the light-transmitting substrate 104. The adhesive layer 218 is disposed between the light-absorbing layer 520 and the semiconductor elements 106.

In the element formation step according to the seventh embodiment, the light-absorbing layer 520 and the adhesive layer 218 are formed on the light-transmitting substrate 104 in order. In the element adhesion step according to the seventh embodiment, semiconductor elements 106 on the donor substrate 102 (not shown in FIG. 7) are adhered to the adhesive layer 218 on the light-transmitting substrate 104, and then the semiconductor elements 106 are separated from the donor substrate 102, by which the semiconductor elements 106 are transferred from the donor substrate 102 to the light-transmitting substrate 104.

Referring to FIG. 7, in the seventh embodiment, before the element transfer step, a shielding layer 524 may be disposed on a second surface 116 of the light-transmitting substrate 104. The second surface 116 of the light-transmitting substrate 104 is opposing to the first surface 110 of the light-transmitting substrate 104. The shielding layer 524 has an opening pattern corresponding to a region where the semiconductor elements 106 are disposed in. In the element transfer step according to the seventh embodiment, the irradiating step R is performed to the light-transmitting substrate 104 under a condition that the semiconductor elements 106 are wholly separated from the acceptor substrate 112 by the empty space 114. The region of the light-transmitting substrate 104 irradiated by the irradiating step R is controlled by using the shielding layer 524 having the opening pattern overlapping with the semiconductor elements 106. Therefore, a portion of the light-absorbing layer 520 corresponding to the semiconductor elements 106 may absorb the optical energy from the irradiating step R and turns it to the heat energy, by which at least a portion of the adhesive layer 218 adjoined with the light-absorbing layer 520 may be vaporized to form the gas pressure force capable of pushing away the semiconductor elements 106 so as to transfer the semiconductor elements 106 from the light-transmitting substrate 104 to the acceptor substrate 112.

Eighth Embodiment

Figure 8A:
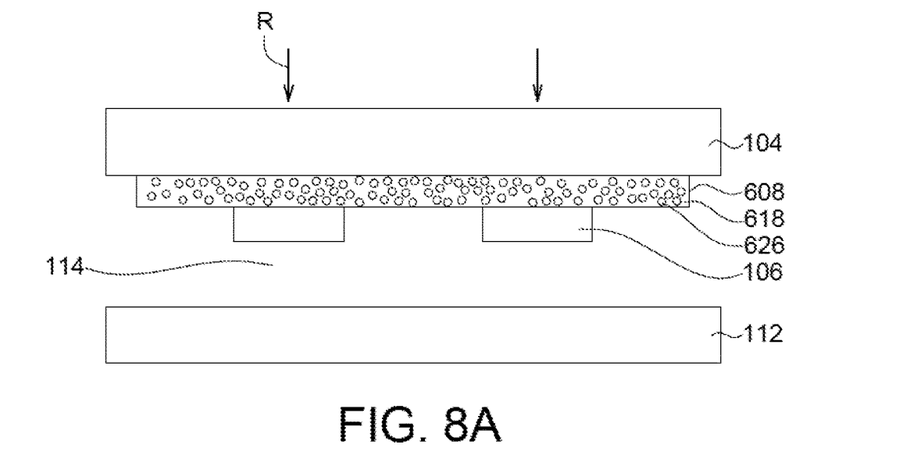
FIG. 8A to FIG. 8B illustrate a manufacturing method for a semiconductor structure according to a concept of an eighth embodiment.
Figure 8B:
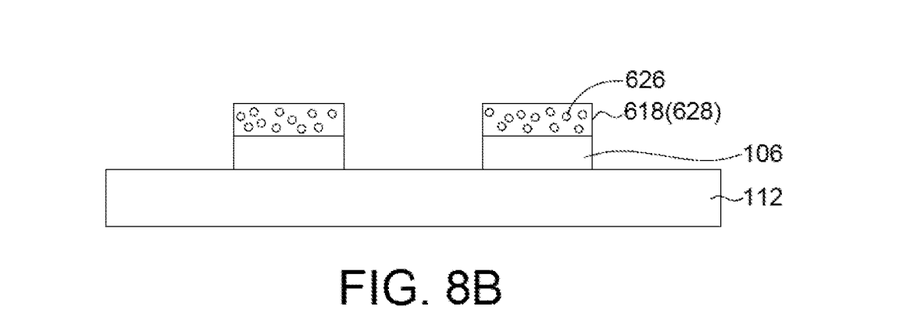

FIG. 8A to FIG. 8B illustrate a manufacturing method for a semiconductor structure according to a concept of an eighth embodiment. The eighth embodiment is similar to the third embodiment. It should be noted that in the eighth embodiment, a light-absorbing and vaporizable adhesive layer 608 comprises an adhesive layer 618 containing quantum dots 626. The semiconductor elements 106 are adhered to the adhesive layer 618 containing the quantum dots 626. In embodiments, the adhesive layer 618 has a conductive property or has a non-conductive property. Referring to FIG. 8A, in the element transfer step according to the eighth embodiment, the irradiating step R is performed to the light-transmitting substrate 104 under a condition that the semiconductor elements 106 are totally separated from the acceptor substrate 112 by the empty space 114. The adhesive layer 618 or another element adjacent to the adhesive layer 618 may absorb the optical energy from the irradiating step R and turn the optical energy into the heat energy causing the vaporizing phenomenon and generating the gas pressure force pushing the semiconductor elements 106 from the light-transmitting substrate 104 to transfer to the acceptor substrate 112. The adhesive layer 618 may also comprise a composition having the light-absorbing property. In an embodiment, the semiconductor elements 106 and the adhesive layer 618 are transferred together from the light-transmitting substrate 104 to the acceptor substrate 112. In an embodiment, after the element transfer step, a curing step may be performed to the adhesive layer 618 transferred on the acceptor substrate 112.

Referring to FIG. 8B, in the eighth embodiment, after the element transfer step, a formed semiconductor structure comprises the acceptor substrate 112 (the substrate, such as a semiconductor substrate, a circuit board, etc.), the semiconductor elements 106 and the adhesive layer 618 containing the quantum dots 626. In an embodiment, the semiconductor structure may be a light-emitting device. For example, the semiconductor elements 106 may comprise light-emitting diodes, such as micro LEDs. In an embodiment, the adhesive layer 618 may have a conductive property, and after the element transfer step, the curing step may be performed to the adhesive layer 618 transferred onto the acceptor substrate 112 so as to form a conductive film 628. The conductive film 628 has the quantum dots 626 distributed therein. The adhesive layer 618 having a conductive property comprises a conductive organic polymer such as PEDOTS: PSS, but is not limited thereto. In embodiments, the conductive film 628 may be functioned as an electrode layer of the semiconductor elements 106, such as a P-type electrode, an N-type electrode, or a combination thereof for a light-emitting diode. In other embodiments, the adhesive layer 618 may have a non-conductive property, the portion of the adhesive layer 618 transferred onto the acceptor substrate 112 may have a width substantially same as or bigger than a width of the semiconductor elements 106, as an encapsulating structure for the semiconductor elements 106.

Ninth Embodiment

Figure 9A:
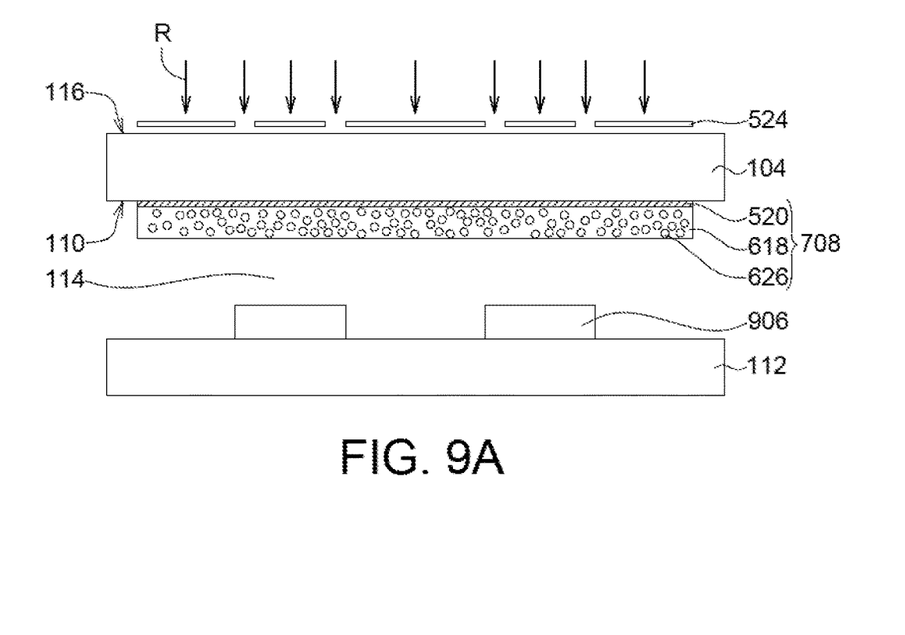
FIG. 9A to FIG. 9B illustrate a manufacturing method for a semiconductor structure according to a concept of a ninth embodiment.
Figure 9B:
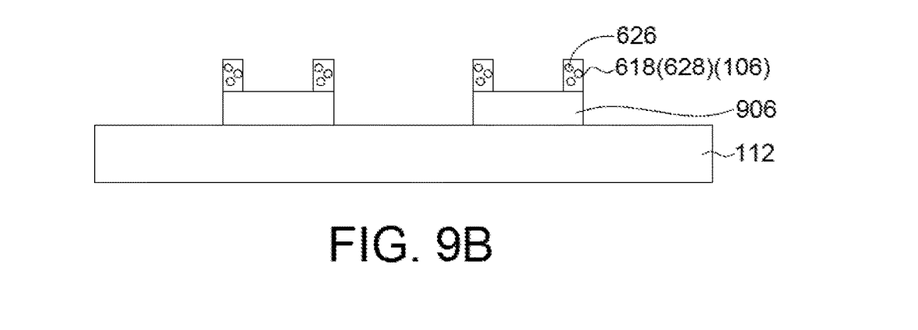

FIG. 9A to FIG. 9B illustrate a manufacturing method for a semiconductor structure according to a concept of a ninth embodiment. In the present embodiment, the adhesive layer 618 containing the quantum dots 626 is transferred as like the semiconductor elements 106. Referring to FIG. 9A, a light-emitting diode 906 is disposed or formed on the acceptor substrate 112. In the element adhesion step, the adhesive layer 618 containing quantum dots 626 is adhered to the first surface 110 of the light-transmitting substrate 104. The adhesive layer 618 containing quantum dots 626 has a conductive property. In the element transfer step, the irradiating step R is performed to the light-transmitting substrate 104 to cause a vaporization between the light-transmitting substrate 104 and the adhesive layer 618 containing quantum dots 626 so as to push the adhesive layer 618 containing quantum dots 626 away from the light-transmitting substrate 104, by which the adhesive layer 618 containing quantum dots 626 passes through the empty space 114 and transfer onto the light-emitting diode 906 on the acceptor substrate 112.

Specifically, a light-absorbing and vaporizable adhesive layer 708 may comprise the light-absorbing layer 520 and the adhesive layer 618. The light-absorbing layer 520 is disposed on the first surface 110 of the light-transmitting substrate 104. The adhesive layer 618 contains the quantum dots 626, and is disposed on the light-absorbing layer 520 between the first surface 110 of the light-transmitting substrate 104 and the adhesive layer 618. Moreover, the shielding layer 524 is disposed on the second surface 116 of the light-transmitting substrate 104. The shielding layer 524 has an opening pattern corresponding to a region where the light-emitting diode 906 is disposed in. In the element transfer step according to the ninth embodiment, the irradiating step R is performed to the light-transmitting substrate 104 under a condition that the light-emitting diode 906 is totally separated from the adhesive layer 618 by the empty space 114. The region irradiated by the irradiating step R is controlled by using the shielding layer 524 having the opening pattern corresponding to the region where the light-emitting diode 906 is disposed in. The light-absorbing layer 520 may absorb the optical energy from the irradiating step R, causing a vaporization generating the gas pressure force capable of pushing the adhesive layer 618 away from the light-transmitting substrate 104, by which the adhesive layer 618 transfer onto the light-emitting diode 906 on the acceptor substrate 112. Specifically, the opening pattern of the shielding layer 524 overlaps with only two end portions of the light-emitting diode 906, and thus the transferred portion of the adhesive layer 618 is only on the two end portions of the light-emitting diode 906. In other embodiments, the region of the adhesive layer 618 transferred to the light-emitting diode 906 by be controlled by adjusting the opening pattern of the shielding layer 524. In an embodiment, after the element transfer step, a curing step may be performed to the adhesive layer 618 on the acceptor substrate 112.

Referring to FIG. 9B, in the ninth embodiment, after the element transfer step, a formed semiconductor structure comprises the acceptor substrate 112, the light-emitting diode 906 and the adhesive layer 618 containing the quantum dots 626. The adhesive layer 618 may have a conductive property, and after the element transfer step, a curing step may be performed to the adhesive layer 618 transferred onto the acceptor substrate 112 so as to form the conductive film 628. In embodiments, the conductive film 628 may be functioned as an electrode layer of the semiconductor elements 106, such as a P-type electrode, an N-type electrode, or a combination thereof for a light-emitting diode. In other embodiments, for example, the adhesive layer 618 may have a non-conductive property.

According to the foregoing embodiments, the concepts of the present disclosure have at least the following advantages. In the element transfer step, the semiconductor element may transfer by being pushed through the vaporization caused from the irradiation step performed to the light-absorbing and vaporizable adhesive layer. Therefore, the transferring method is simple and fast, and can be used to control the portion of the semiconductor elements to be transferred precisely. In addition, the semiconductor element may transfer directly from light-transmitting substrate onto the acceptor substrate by using the irradiating step without using any additional jig for transferring, and thus the transferring method is simple and has a low cost. Moreover, in the element transfer step, the elements respectively on the two separated substrates are separated from each other by the empty space and do not contact each other, and thus the damage problem due to a contacting between the elements can be avoided to increase the product yield. Furthermore, the portion to be vaporized by the irradiating step can be controlled by using the shielding layer or the light-absorbing layer providing the self-aligning effect, and thus the irradiating can have a bigger misalignment-tolerant.

While the disclosure has been described by way of example and in terms of the preferred embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A manufacturing method for a semiconductor structure, comprising:
   an element adhesion step comprising adhering a semiconductor element onto a first surface of a light-transmitting substrate; and
   an element transfer step comprising performing an irradiating step to the light-transmitting substrate being wholly separated from an acceptor substrate by an empty space so as to cause a vaporizing phenomenon between the light-transmitting substrate and the semiconductor element, wherein the vaporizing phenomenon allows the semiconductor element to be pushed away from the light-transmitting substrate and then pass through the empty space to get onto the acceptor substrate.

2. The manufacturing method for the semiconductor structure according to claim 1, wherein the semiconductor element comprises a semiconductor light-emitting element, an adhesive layer containing quantum dots, or a combination thereof, wherein the adhesive layer containing the quantum dots has a conductive property or a non-conductive property.

3. The manufacturing method for the semiconductor structure according to claim 1, wherein the semiconductor element comprises an adhesive layer containing quantum dots, the manufacturing method further comprises disposing a light-emitting diode on the acceptor substrate, wherein the element transfer step allows the adhesive layer containing the quantum dots to be pushed away from the light-transmitting substrate, and then pass through the empty space to get onto the light-emitting diode.

4. The manufacturing method for the semiconductor structure according to claim 1, wherein the irradiating step uses a laser light source.

5. The manufacturing method for the semiconductor structure according to claim 1, further comprising:
   an element formation step comprising forming the semiconductor element on a donor substrate, wherein the element adhesion step comprises adhering the semiconductor element to the light-transmitting substrate, and transferring the semiconductor element from the donor substrate to the light-transmitting substrate.

6. The manufacturing method for the semiconductor structure according to claim 1, wherein the element adhesion step comprising adhering the semiconductor element and the light-transmitting substrate with using a light-absorbing and vaporizable adhesive layer, and the vaporizing phenomenon occurs in the light-absorbing and vaporizable adhesive layer by the irradiating step.

7. The manufacturing method for the semiconductor structure according to claim 6, wherein the element transfer step comprises transferring the light-absorbing and vaporizable adhesive layer and the semiconductor element together from the light-transmitting substrate to the acceptor substrate.

8. The manufacturing method for the semiconductor structure according to claim 6, wherein the light-absorbing and vaporizable adhesive layer is a single-layer film or a multilayer film.

9. The manufacturing method for the semiconductor structure according to claim 1, wherein before the element transfer step, the manufacturing method comprises:
   disposing an adhesive layer on the first surface of the light-transmitting substrate; and
   disposing a light-absorbing layer on the first surface of the light-transmitting substrate, and overlapping with the semiconductor element.

10. The manufacturing method for the semiconductor structure according to claim 9, wherein a heat energy is generated in the light-absorbing layer by the irradiating step, and a portion of the adhesive layer adjoined with the light-absorbing layer is vaporized due to the heat energy.

11. The manufacturing method for the semiconductor structure according to claim 9, further comprising before the disposing the adhesive layer, disposing a vaporizable layer on the first surface of the light-transmitting substrate, wherein a heat energy is generated in the light-absorbing layer by the irradiating step, and a portion of the vaporizable layer adjoined with the light-absorbing layer is vaporized due to the heat energy.

12. The manufacturing method for the semiconductor structure according to claim 1, wherein the semiconductor element includes a plurality of semiconductor elements, and in the element transfer step, the irradiating step is performed to only a portion of the light-transmitting substrate so as to transfer a portion of the plurality of semiconductor elements on the light-transmitting substrate onto the acceptor substrate.

13. The manufacturing method for the semiconductor structure according to claim 1, further comprising before the irradiating step, disposing a shielding layer on a second surface of the light-transmitting substrate opposing to the first surface.

14. A manufacturing method for a semiconductor structure, comprising:
   an element adhesion step comprising adhering an adhesive layer containing quantum dots onto a first surface of a light-transmitting substrate, wherein the adhesive layer containing the quantum dots has a conductive property; and
   an element transfer step comprising performing an irradiating step to the light-transmitting substrate so as to cause a vaporizing phenomenon between the light-transmitting substrate and the adhesive layer containing the quantum dots, wherein the vaporizing phenomenon allows the adhesive layer containing the quantum dots to be pushed away from the light-transmitting substrate and then pass through an empty space to get onto an acceptor substrate.

15. The manufacturing method for the semiconductor structure according to claim 14, further comprising disposing a light-emitting diode on the acceptor substrate, wherein the adhesive layer containing the quantum dots is pushed away from the light-transmitting substrate and then transfers onto the light-emitting diode by the element transfer step.

16. The manufacturing method for the semiconductor structure according to claim 15, wherein the irradiating step is performed under a condition of the adhesive layer containing the quantum dots being wholly separated from the light-emitting diode by the empty space.

17. The manufacturing method for the semiconductor structure according to claim 14, wherein the element adhesion step further comprises adhering a light-emitting diode to the adhesive layer containing the quantum dots, wherein the element transfer step comprises transferring the adhesive layer containing the quantum dots and the light-emitting diode together from the light-transmitting substrate to the acceptor substrate.

18. The manufacturing method for the semiconductor structure according to claim 14, further comprising after the element transfer step, performing a curing step to the adhesive layer containing the quantum dots transferred onto the acceptor substrate.

\* \* \* \* \*